United States Patent
Watanabe

(10) Patent No.: US 7,315,072 B2
(45) Date of Patent: Jan. 1, 2008

(54) SEMICONDUCTOR DEVICE CAPABLE OF SUPPRESSING CURRENT CONCENTRATION IN PAD AND ITS MANUFACTURE METHOD

(75) Inventor: Kenichi Watanabe, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 225 days.

(21) Appl. No.: 10/050,171

(22) Filed: Jan. 18, 2002

(65) Prior Publication Data

US 2003/0047794 A1    Mar. 13, 2003

(30) Foreign Application Priority Data

Sep. 7, 2001    (JP)    ............... 2001-271416

(51) Int. Cl.
  *H01L 29/00*    (2006.01)
  *H01L 23/52*    (2006.01)
(52) U.S. Cl. ............... 257/503; 257/758; 257/773; 257/774; 257/E23.015; 257/E23.02
(58) Field of Classification Search ............... 257/503, 257/758, 773, 774, E23.015, E23.02
See application file for complete search history.

(56) References Cited

U.S. PATENT DOCUMENTS 6,100,589 A * 8/2000 Tanaka ............... 257/758
6,163,074 A * 12/2000 Lee et al. ............... 257/734
6,297,563 B1 * 10/2001 Yamaha ............... 257/781
6,362,528 B2 * 3/2002 Anand ............... 257/758
6,417,575 B2 * 7/2002 Harada et al. ............... 257/784

FOREIGN PATENT DOCUMENTS

JP    10-229085    8/1998
JP    11-150114    6/1999

* cited by examiner

*Primary Examiner*—Matthew E. Warren
(74) *Attorney, Agent, or Firm*—Kratz, Quintos & Hanson, LLP

(57) ABSTRACT

An interlayer insulating film is formed on a semiconductor substrate. An intra-layer insulating film is formed on the interlayer film. A recess is formed through the intra-layer film. The recess has a pad-part and a wiring-part continuous with the pad-part. The pad-part is wider than the width of the wiring-part. Convex regions are left in the pad-part. The convex regions are disposed in such a manner that a recess area ratio in a near wiring area superposed upon an extended area of the wiring-part into the pad-part, within a first frame area having as an outer periphery an outer periphery of the pad-part and having a first width, becomes larger than a recess area ratio in a second frame area having as an outer periphery an inner periphery of the first frame area and having a second width. A conductive film is filled in the recess.

16 Claims, 16 Drawing Sheets

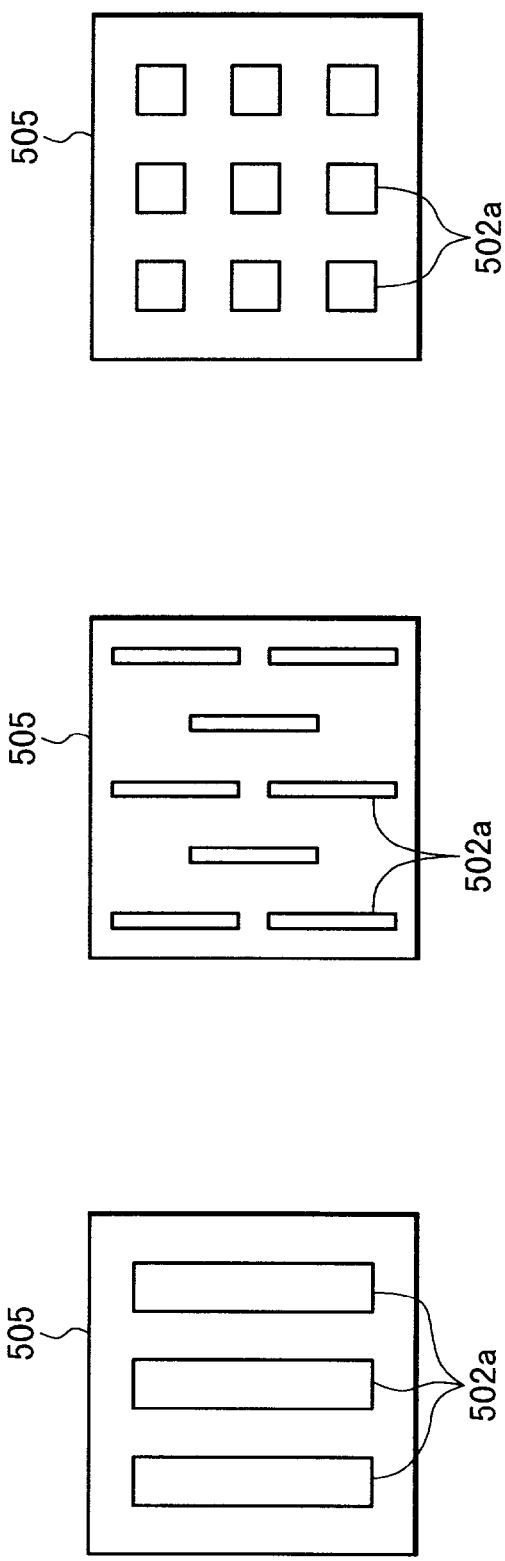

SEMICONDUCTOR DEVICE CAPABLE OF SUPPRESSING CURRENT CONCENTRATION IN PAD AND ITS MANUFACTURE METHOD

CROSS REFERENCE TO RELATED APPLICATION

This application is based on Japanese patent application 2001-271416, filed on Sep. 7, 2001, the whole contents of which are incorporated herein by reference.

BACKGROUND OF THE INVENTION

A) Field of the Invention

The present invention relates to a semiconductor device and its manufacture method, and more particularly to a semiconductor device manufacture method capable of preventing a lower manufacture yield when wiring and pads are formed by a damascene method and to a semiconductor device having a structure suitable for the manufacture method.

B) Description of the Related Art

Design rules of multi-layer wiring structures are becoming smaller as the degree of integration and micro patterning of semiconductor integrated circuit devices (LSI) becomes higher. A method of forming wiring by partially etching a metal layer is nowadays associated with some technical limit. In order to solve this problem, a damascene method is utilized by which a groove for wiring or a via hole for conductive plug is formed through an insulating film, and thereafter conductive material is filled in this groove or via hole.

On a multi layer wiring structure formed through micro patterning, pads are finally formed for connection to external circuits and for inspection. This pad has a relatively large size as compared to other patterns in the multi layer wiring structure.

With reference to FIG. 9A, a conventional method of forming a pad by using a damascene method will be described.

FIG. 9A is a cross sectional view of a pad formed by a damascene method. First, on the surface of an interlayer insulating film 500 formed on a silicon substrate, an etching stopper film 501 and an insulating film 502 are deposited. An opening 503 is formed through these two layers.

Next, a barrier metal layer 504 is formed covering the inner surface of the opening 503 and the upper surface of the insulating film 502. A copper layer is formed on the surface of the barrier metal layer 504 by sputtering. By using this copper layer as a seed layer, a thick copper layer is formed by plating. The copper layer formed by plating is filled in the opening 503.

The copper layer and barrier metal layer deposited on the insulating film 502 are removed by chemical mechanical polishing (CMP). As shown in FIG. 9A, a pad 505 made of the copper layer formed by plating is left in the opening 503.

If the area of the pad 505 is large, the upper surface of the pad 505 becomes depressed. This phenomenon is called dishing. The upper surface of the insulating film 502 gradually lowers toward the pad 505. This phenomenon is called erosion. The pad after CMP has a depressed surface.

As shown in FIG. 9B, on the surface with dishing and erosion, an etching stopper film 506 of silicon nitride and an interlayer insulating film 507 of silicon oxide are deposited. The surface of the interlayer insulating film 506 has a depressed surface in conformity with the surface of the underlying layer. A resist film is formed on the surface of the interlayer insulating film 507. When a pattern is formed by photolithography, a focus depth margin during exposure becomes small. If wiring is formed on this depressed surface by a damascene method, residue of a conductive film is formed after CMP and plugs may be electrically shorted.

FIG. 9C is a cross sectional view of a pad in which the insulating film 502 shown in FIG. 9A is replaced with a two-layer structure of a lower insulating film 502A and an upper insulating film 502B. The lower insulating film 502A is made of silicon oxide doped with fluorine, and the upper insulating film 502B is made of silicon oxide. As erosion is formed, the lower insulating film 502A is exposed in some cases at the area contacting the border of the opening 503. Silicon oxide doped with fluorine has a high hygroscopicity so that the exposed insulating film 502A absorbs moisture. The silicon oxide film doped with fluorine and absorbed moisture may generate gas at a succeeding heat treatment process or may cause a lower tight adhesion.

If the lower insulating film is made of insulating organic material such as polyallyl ether, in addition to moisture absorption and lowered tight adhesion, the following problem arises. As shown in FIG. 9D, before wiring is formed on the pad 505 by a damascene method, an etching stopper film 506 of silicon nitride is formed. When this etching stopper film 506 is formed by plasma enhanced chemical vapor deposition (PE-CVD), plasma of $H_2$ and $NH_3$ is generated. Therefore, the exposed insulating film 502A is exposed by plasma of $H_2$ and $NH_3$ and etched by the plasma and a gap is formed in some cases. The film itself may be decomposed and the tight adhesion may be lowered.

In order to remove a thin copper oxide film formed on the surface of the Cu pad before the etching stopper film 506 is formed, a reduction process is performed by using, for example, $NH_3$ plasma. During this reduction process, the insulating film 502A may be decomposed.

FIGS. 10A to 10C are plan views of pads proposed to suppress the generation of dishing and erosion. The pads shown in FIGS. 10A and 10C are disclosed in JP-A-11-150114, and the pad shown in FIG. 10B is disclosed in JP-A-10-229085. In either case, insulating regions 502a of the insulating layer 502 shown in FIG. 9A are left. These insulating regions 502a function as a polishing stopper layer for CMP so that generation of dishing and erosion can be suppressed.

FIG. 11 is a plan view of a pad and a wiring pattern continuous with the pad. The wiring pattern 510 is connected to one side of a square pad 505. A plurality of square insulating regions 502a are disposed in the pad 505 in a matrix shape. In order to improve the effects of suppressing the generation of dishing and erosion, the size of each insulating region 502a is made smaller and the number of regions is increased, as compared to the regions shown in FIG. 10C.

The width of the wiring pattern 510 is represented by W1, the distance from the outer periphery of the pad 505 to the outermost insulating region 502a is represented by W2, and a distance between adjacent insulating regions 502a is represented by W3. Consider a closed line 511 which traverses the wiring pattern 510 and extends along a plurality of insulating regions 502a disposed nearest to the border line between the pad 505 and wiring pattern 510. In the pad shown in FIG. 11, the closed line 511 extends along the insides of the six insulating regions 502a. In the following, it is assumed that the closed line 511 extends along (n+1) insulating regions.

When current flows from the wiring 510 to the pad 505, current inflowing to the closed line 511 is equal to current outflowing from the closed line 511. Namely, the current passing through the length W1 where the closed line 511 and wiring 510 are crossed is equal to the current passing through the length of 2×W2+n×W3 where the closed line 511 and wiring 510 cross.

If the following inequality is satisfied and the density of current flowing in the wiring 510 takes an allowable limit value, the density of current flowing along a direction crossing the closed line 511 exceeds an allowable limit value:

$$W1 > 2 \times W2 + n \times W3$$

The characteristics of a semiconductor device formed on a silicon substrate are inspected, for example, by contacting a conductive probe to the pad 505. If the insulating regions 502a are dispersed in the inside of the pad 505, contact between the pad 505 and conductive probe may become unstable.

SUMMARY OF THE INVENTION

It is an object of the present invention to provide a semiconductor device having a pad structure capable of suppressing excessive current concentration in a pad and its manufacture method.

It is another object of the present invention to provide a semiconductor device having a pad structure capable of mitigating instability of contact between a pad and an inspection probe and its manufacture method.

According to one aspect of the present invention, there is provided a method of manufacturing a semiconductor device comprising steps of: (a) forming a first interlayer insulating film made of insulating material on a semiconductor substrate having semiconductor elements formed on a surface of the substrate; (b) forming a first intra-layer insulating film made of insulating material on the first interlayer insulating film; (c) forming a recess through the first intra-layer insulating film, wherein the recess has a pad part and a wiring part continuous with the pad part, the pad part has a width wider than a width of the wiring part, a plurality of convex regions are left in the pad part, and the recess is formed so that the convex regions are disposed in such a manner that a recess area ratio in a near wiring area superposed upon an extended area of the wiring part into the pad part, within a first frame area having as an outer periphery an outer periphery of the pad part and having a first width, becomes larger than a recess area ratio in a second frame area having as an outer periphery an inner periphery of the first frame area and having a second width; (d) forming a first film made of conductive material on the semiconductor substrate, the first film being filled in the recess; and (e) removing an upper region of the first film to form a first pad made of the first film left in the recess.

According to another aspect of the invention, there is provided a semiconductor device comprising: a semiconductor substrate; a first interlayer insulating film made of insulating material and formed on the semiconductor substrate; a first intra-layer insulating film made of insulating material and formed on the first interlayer insulating film, the first intra-layer insulating film being formed with a recess reaching a bottom of the first intra-layer insulating film, the recess having a pad part and a wiring part continuous with the pad part, the pad part having a width wider than a width of the wiring part, a plurality of convex regions being left in the pad part, and the recess being formed so that the convex regions are disposed in such a manner that a recess area ratio in a near wiring area superposed upon an extended area of the wiring part into the pad part, within a first frame area having as an outer periphery an outer periphery of the pad part and having a first width, becomes larger than a recess area ratio in a second frame area having as an outer periphery an inner periphery of the first frame area and having a second width; a first pad filled in the pad part of the recess; and a wiring filled in the wiring part of the recess.

Since a plurality of convex regions are left in the pad part of the recess, it is possible to suppress the formation of a depressed upper surface of the first film in the pad part, when the first film is etched at the step (e). Since the recess area ratio in the near wiring area is relatively large, the first pad area ratio in the near wiring area becomes large. It is therefore possible to avoid excessive current concentration in a particular area in the first pad when current is flowed from the wiring to the pad.

BRIEF DESCRIPTION OF THE DRAWINGS

FIGS. 10A to 10C are plan views of pads used with a conventional semiconductor device.

DESCRIPTION OF THE PREFERRED EMBODIMENTS

Figure 1:
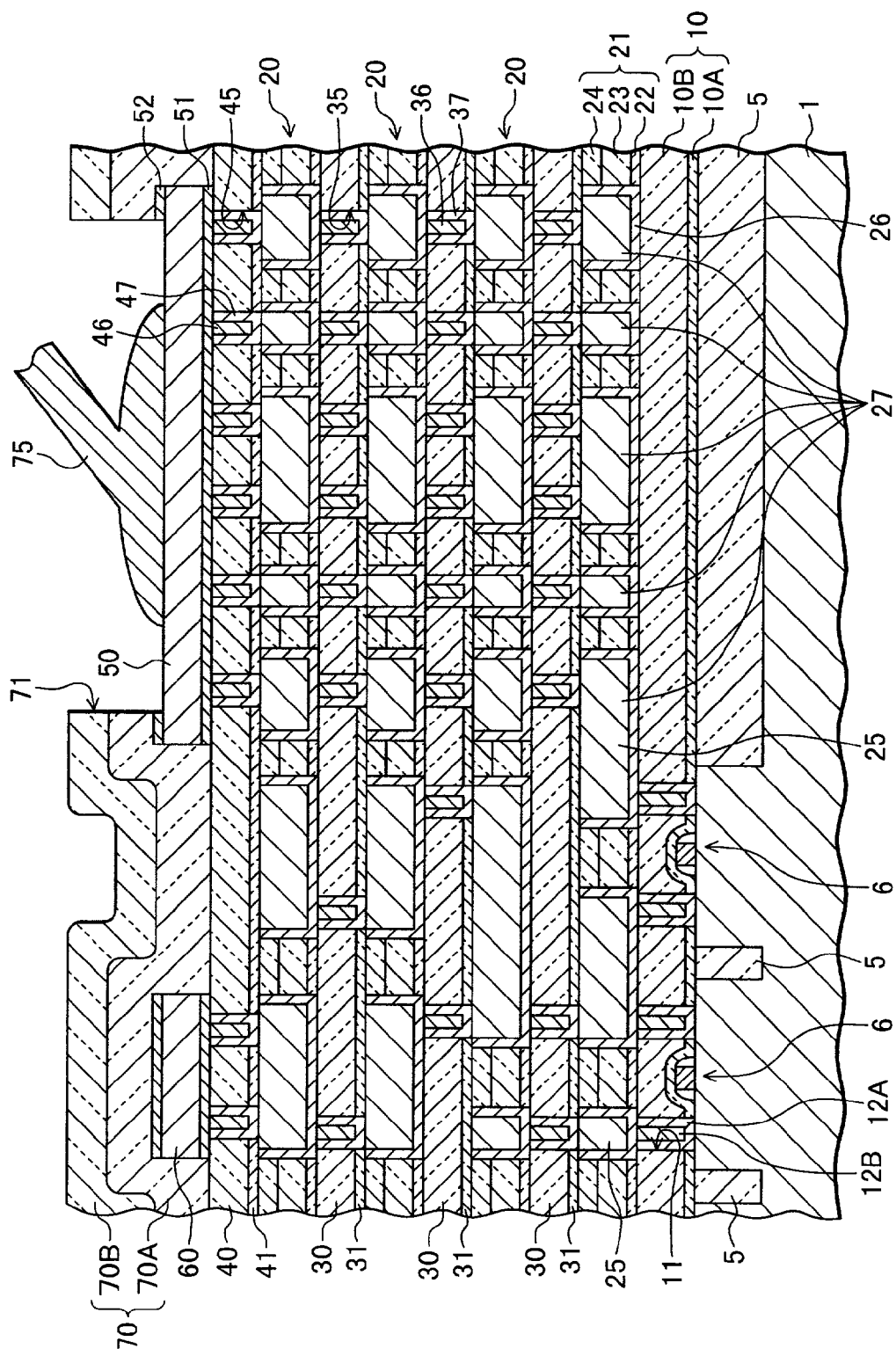
FIG. 1 is a cross sectional view of a semiconductor device according to a first embodiment.

FIG. 1 is a cross sectional view of a semiconductor device according to the first embodiment of the invention. In the surface layer of a semiconductor substrate 1, an element separation insulating film 5 is formed which defines active regions. The element separation insulating film 5 is made of local oxidation of silicon (LOCOS) or shallow trench isolation (STI). A MOS field effect transistor (MOSFET) 6 is formed on the surface of the active region.

An interlayer insulating film 10 is formed on the semiconductor substrate 1, covering MOSFET 6. The interlayer insulating film 10 has a two-layer structure of a lower layer 10A made of silicon nitride and an upper layer 10B made of silicon oxide. Via holes 11 are formed through the interlayer insulating film 10. The via holes 11 are formed in the areas corresponding to the source/drain regions of MOSFET 6. The inner surface of the via hole 11 is covered with a barrier layer 12A made of titanium nitride (TiN), and a conductive plug 12B made of tungsten (W) is filled in the via hole 11.

The structure described above can be formed by well-known film forming techniques, photolithography, chemical mechanical polishing and the like.

Four wiring layers 20 are formed on the interlayer insulating film 10. An interlayer insulating 30 is disposed between upper and lower wiring layers 20. Each wiring layer 20 includes intra-layer insulating films 21, wiring patterns 25 and pads 27. The wiring pattern 25 and pad 27 are filled in a groove (recess) reaching the bottom of the intra-layer insulating film 21. A barrier metal layer 26 is disposed at the interface between the inner surface of the groove and the wiring pattern 25 and at the interface between the inner surface of the groove and the pad 27. For example, the wiring pattern 25 and pad 27 are made of copper (Cu) and the barrier metal layer 26 is made of tantalum nitride (TaN). The thickness of the barrier layer 26 is, for example, 30 nm.

Each intra-layer insulating film 21 has a three-layer structure of an etching stopper film 22, an intermediate film 23 and an upper film 24 sequentially stacked in this order from the semiconductor substrate 1 side. For example, the etching stopper film 22 is made of silicon nitride and has a thickness of 50 nm, the intermediate film 23 is made of silicon oxide doped with fluorine and has a thickness of 350 nm, and the upper film 24 is made of silicon oxide and has a thickness of 150 nm.

An etching stopper film 31 is disposed between the interlayer insulating film 30 and the underlying wiring layer 20. For example, the interlayer insulating film 30 is made of silicon oxide and has a thickness of 500 nm, and the etching stopper film 31 is made of silicon nitride and has a thickness of 50 nm.

Via holes 35 are formed through the two films, the interlayer insulating film 30 and etching stopper layer 31. A conductive plug 36 is filled in the via hole 35. A barrier metal layer 37 is disposed between the inner surface of the via hole 35 and the plug 36. For example, the barrier metal layer 37 is made of tantalum nitride and has a thickness of 30 nm, and the plug 36 is made of Cu and electrically connects upper and lower wiring patterns or pads.

The pads 27 having the same pattern are disposed in all the wiring layers 20 at the same position in the substrate plane. The shape of the pad 27 will be later detailed.

On the fourth wiring layer 40, an etching stopper film 41 and an interlayer insulating film 40 are stacked in this order. Via holes 45 are formed through the two films, the interlayer insulating film 40 and etching stopper film 41. A conductive plug 46 is filled in the via hole 45. An adhesive layer 47 is disposed between the inner surface of the via hole 45 and the plug 46. For example, the adhesive layer 47 is made of TiN and has a thickness of 200 nm, and the plug 46 is made of tungsten (W).

A pad 50 is formed on the interlayer insulating film 40 in the area corresponding to the pads 27. A barrier metal layer 51 is disposed between the pad 50 and interlayer insulating film 40. The pad 50 is connected to the underlying pads 27 via the plugs 46. On the other upper surface of the interlayer insulating film 40, wiring patterns 60 and pads are formed. These pads are used, for example, for circuit test, wire bonding or bump forming.

A cover film 70 is formed on the interlayer insulating film 40, covering the pad 50 and wiring patterns 60. The cover film 70 has a two-layer structure of a silicon oxide film 70A of 1000 nm in thickness and a silicon nitride film 70B of 500 nm in thickness. An opening 71 is formed through the cover film 70 to expose the upper surface of the pad 50. A barrier metal layer 52 is formed on the upper surface of the pad 50 at the interface between the unexposed area of the pad 50 and the cover film 70.

For example, the pad 50 is made of AlCu alloy (Cu content: 0.5 wt %) and has a thickness of 1000 nm, and each of the barrier metal layers 51 and 52 is made of TiN and has a thickness of 50 nm. A conductive wire 75 is wire-bonded to the upper surface of the pad 50. The conductive wire 75 is electrically connected to a semiconductor device formed on the surface of the semiconductor substrate 1, e.g., MOSFET 6, via the pads 27 and plugs 36 of the underlying wiring layers.

Figure 2A:
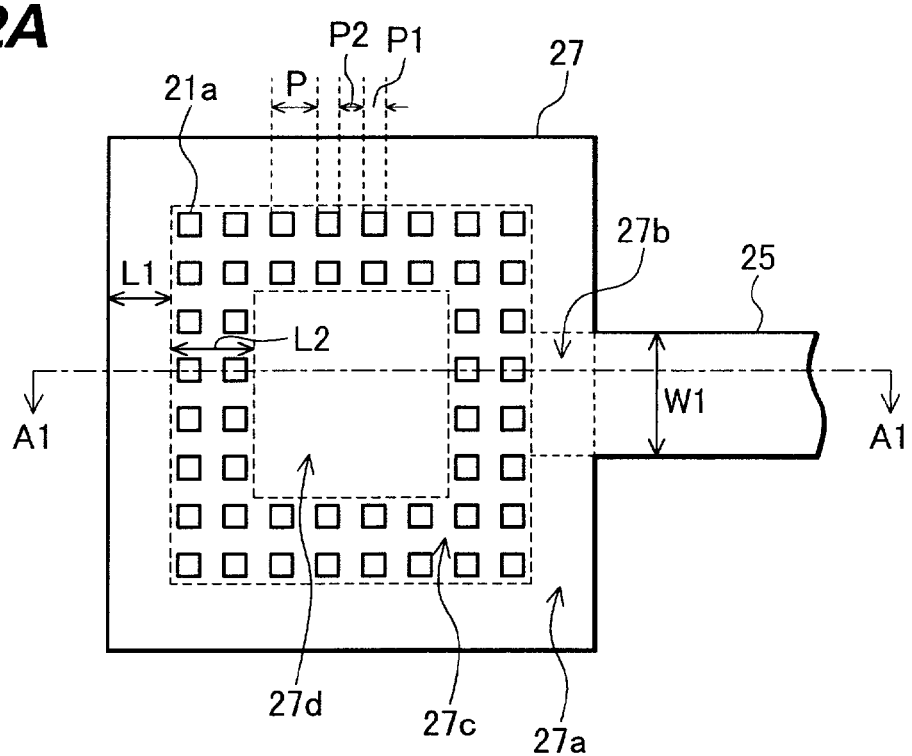
FIG. 2A is a plan view of a pad used with the semiconductor device of the first embodiment.

FIG. 2A is a plan view of the pad 27 disposed in the first wiring layer 20. The cross sectional view of FIG. 1 is taken along one-dot chain line A1—A1 shown in FIG. 2A. The pad 27 is continuous with the wiring pattern 25. The pads 27 disposed in the second to fourth wiring layers 20 shown in FIG. 1 have the same plan view as the pad 27 shown in FIG. 2A.

The inside of the pad 27 is divided into a first frame area 27a, a second frame area 27c and a central area 27d. The first frame area 27a has, as its outer periphery, the outer periphery of the pad 27 and has a width of L1. The second frame area 27c has, as its outer periphery, the inner periphery of the first frame area 27a and has a width of L2. The central area 27d is inside of the inner periphery of the second frame area 27c. An area 27b where the area defined by extending the wiring pattern 25 into the pad 27 superposes upon the first frame area 27a is called a near wiring area.

A plurality of square insulating regions 21a are disposed in the second frame region 27c. The insulating region 21a is not disposed in the first frame area 27a and central area 27d. The insulating regions 21a are regularly (periodically) disposed at a pitch P in the second frame area 27c along both the horizontal and vertical directions. The length of one side of the insulating region 21a is represented by P1, and the distance between adjacent insulating regions 21a is represented by P2.

The width L1 of the first frame area 27a is equal to or wider than the distance P2.

In the pad 27 shown in FIG. 2A, the insulating region 21a is not disposed in the first frame area 27a, particularly in the near wiring area 27b. Therefore, current flowing from the wiring 25 into the pad 27 or current flowing from the pad 27 into the wiring 25 can be prevented from excessive current concentration. In order to more efficiently avoid excessive current concentration, it is preferable to set the width L1 equal to or wider than the distance P2, and more preferable to set it equal to or wider than the pitch P. If the insulating regions are not disposed periodically, it is preferable to set the width L1 wider than the shortest distance between adjacent two insulating regions 21a.

Figure 11:
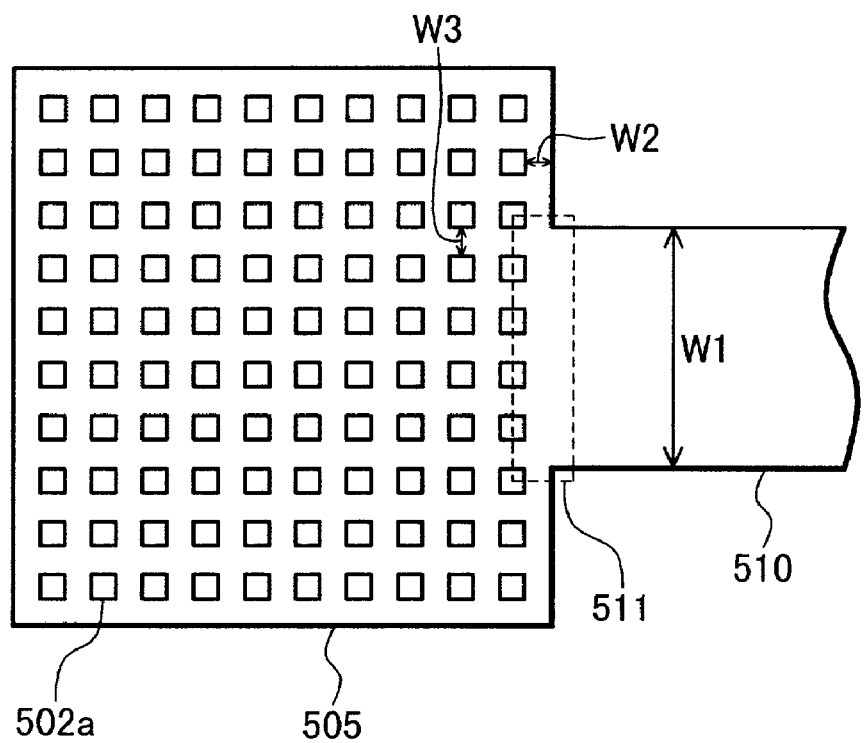
FIG. 11 is a plan view of pads and wiring patterns used for explaining the reason of current concentration.
Figure 12:
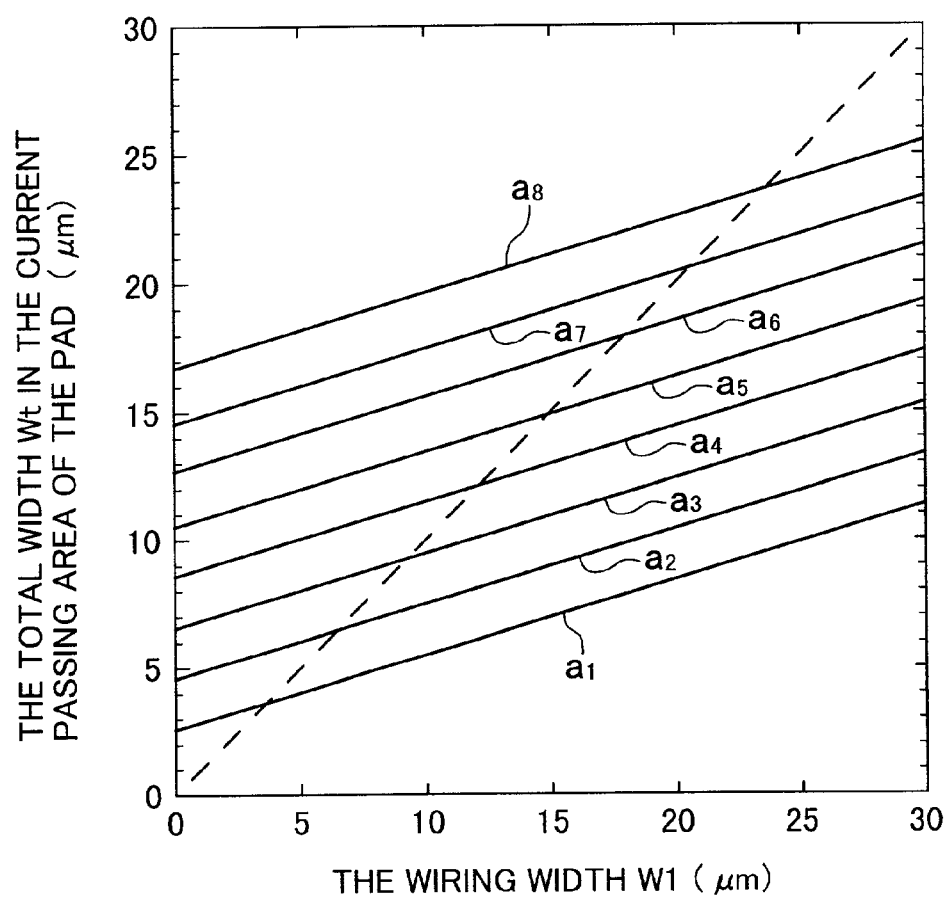
FIG. 12 is a graph showing the relation between a total width Wt of the current passing area of a pad and a wiring width W1.

Next, the relation between the width L1 and the width W1 of the wiring 25 will be described. FIG. 12 shows the relation between the wiring width W1 and the total width Wt of an area in the pad 27 where current from the wiring 25 flows. The width Wt corresponds to 2×W2+n×W3 shown in FIG. 11 and the inequality (1). The width L1 and distance P2 shown in FIG. 2A correspond to the widths W2 and W3 shown in FIG. 11, respectively.

In the graph shown in FIG. 12, the pitch P is 2.5 µm and the distance P1 is 1.0 µm. The abscissa represents the wiring width W1 in the unit of "µm" and the ordinate represents the total width Wt in the current passing area of the pad in the unit of "µm".

Straight lines a1 to a8 shown in FIG. 12 correspond to the widths L1 of 1 µm, 2 µm, 3 µm, 4 µm, 5 µm, 6 µm, 7 µm and 8 µm, respectively. In the area of Wt≧W1 (an upper left area of a broken line), excessive current concentration does not occur.

For example, if the wiring width W1 is 10 µm and the width L1 is equal to or wider than 3.5 µm, it can be known from the graph that excessive current concentration does not occur. If the wiring width W1 is 5 µm and the width L1 is 1.5 µm or wider, then no excessive current concentration occurs. More in general, it can be considered that if the wiring width W1 is in a range from 5 µm to 10 µm, a preferable range of L1/W1 is 35% or higher, whereas if the wiring width W1 is narrower than 5 µm, a preferable range of L1/W1 is 30% or higher.

Strictly speaking, although this preferable range may vary with the pitch P and distance P2, problems to be caused by excessive current concentration can be avoided if the pad design is made so as to satisfy the above-described conditions.

Figure 2B:
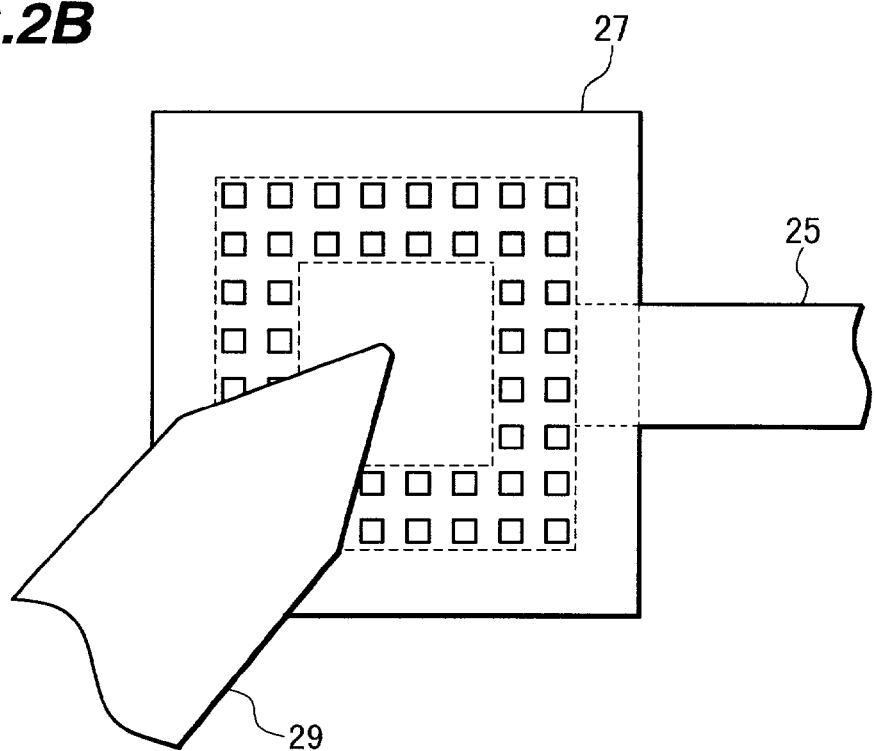
FIG. 2B is a diagram illustrating an inspection probe in contact with the pad.

In some cases the characteristics of a semiconductor element formed on the surface of the semiconductor substrate are inspected prior to forming the second to upper wiring layers after the first wiring layer 20 shown in FIG. 1 is formed. In this inspection, as shown in FIG. 2B, an inspection probe 29 is made in contact with the pad 27 formed in the first wiring layer 20 to supply a power source voltage or detect an output signal. Since the pads are disposed at the same position of each wiring layer 20, such inspection can be performed after each wiring layer 20 is formed.

As shown in FIGS. 2A and 2B, since the insulating region 21a is not disposed in the central area 27d of the pad 27, a stable contact between the inspection probe and pad 27 can be attained. In order to attain a high contact stability, it is preferable to make the size and shape of the central area 27d be inclusive of a circle having a diameter of 20 µm. It is preferable to set the area of the central area 27d to a quarter or smaller of the area of the pad 27 (the area including the insulating regions 21a).

Next, with reference to FIGS. 3A to 3E, the pad 27 and its upper plug 36 shown in FIG. 1 will be described. In FIGS. 3A to 3E, a method of forming the pad 27 and its upper plug 36 in the first wiring layer 20 will be described by way of example. The pads 27 and its upper plugs 36 in the other wiring layers 20 can be formed in a similar manner.

Figure 3A:
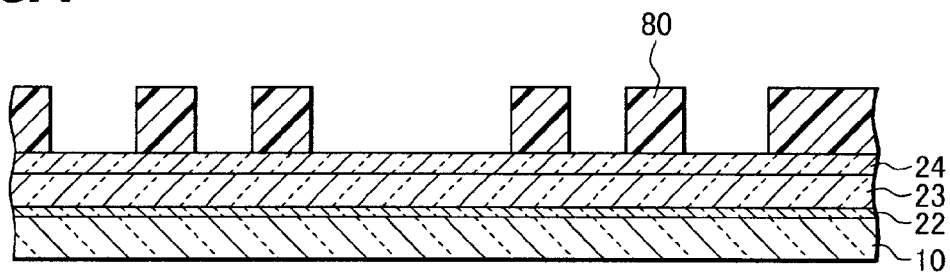
FIGS. 3A to 3E are cross sectional views illustrating a method of manufacturing a semiconductor device according to the first embodiment.

As shown in FIG. 3A, on an interlayer insulating film 10, an etching stopper film 22 is formed which is made of silicon nitride (SiN) and has a thickness of 50 nm. For example, the etching stopper film 22 can be formed by plasma enhanced chemical vapor deposition (PE-CVD) by using silane (SiH$_4$) and ammonium (NH$_3$) as source gasses.

On the etching stopper film 22, an intermediate film 23 is formed which is made of silicon oxide doped with fluorine (SiOF) and has a thickness of 350 nm. For example, the intermediate film 23 can be formed by PE-CVD by using fluorosilane (SiF$_4$) and oxygen (O$_2$) as source gasses.

On the intermediate film 23, an upper film 24 is formed which is made of silicon oxide (SiO$_2$) and has a thickness of 150 nm. For example, the upper film 24 can be formed by PE-CVD by using silane and oxygen (O$_2$) as source gasses.

On the upper film 24, a resist pattern 80 is formed. The resist pattern 80 has openings corresponding to the pads 27 and wiring patterns 25. By using the resist pattern 80 as a mask, the upper film 24 and intermediate layer 23 are etched. This etching can be performed by reactive ion etching (RIE) by using CF containing gas (e.g., gas which contains CF$_4$, C$_4$F$_8$ or the like).

Thereafter, the resist pattern 80 is ashed by using oxygen plasma. By using the patterned upper film 24 and intermediate film 23 as a mask, the etching stopper film 22 is etched. This etching can be performed by RIE by using CHF containing gas (e.g., gas which contains CHF$_3$).

Figure 3B:
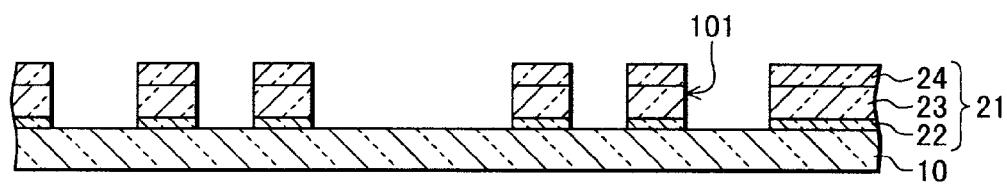

As shown in FIG. 3B, an intra-layer insulating film 21 is therefore left which has a three-layer structure of the etching stopper film 22, intermediate film 23 and upper film 24. The intra-layer insulating film 21 has a recess 101 in which a pad 27 is formed.

Figure 3C:
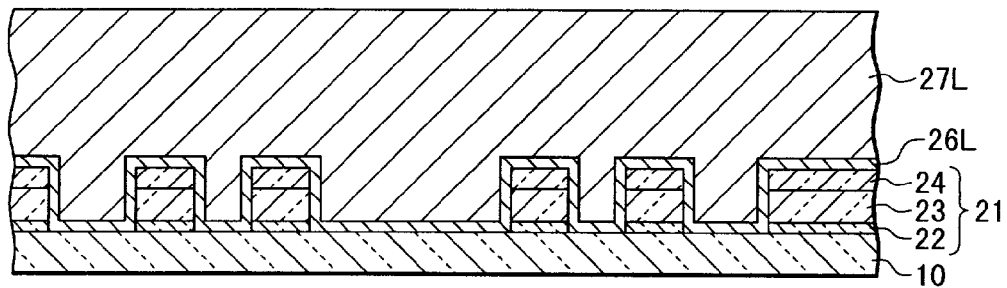

As shown in FIG. 3C, a TaN layer 26L having a thickness of 30 nm is formed on the whole surface of the substrate by sputtering. On the surface of the TaN layer 26L, a Cu layer is formed by sputtering. By using this Cu layer as a seed layer, a Cu layer 27L having a thickness of 1500 nm is formed by plating.

Figure 3D:
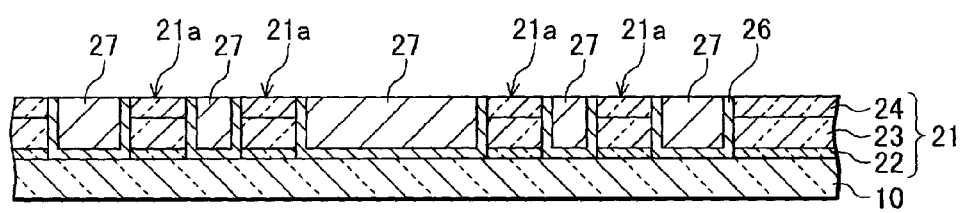

As shown in FIG. 3D, CMP is performed until the upper surfaces of the upper film 24 is exposed, to remove unnecessary Cu layer 27L and TaN layer 26L. A barrier metal layer 26 made of a portion of the TaN layer 26L and a pad 27 made of a portion of the Cu layer 27L are left in the opening 101. Since the insulating regions 21a are disposed in the pad 27, formation of dishing and erosion during CMP can be suppressed.

Figure 3E:
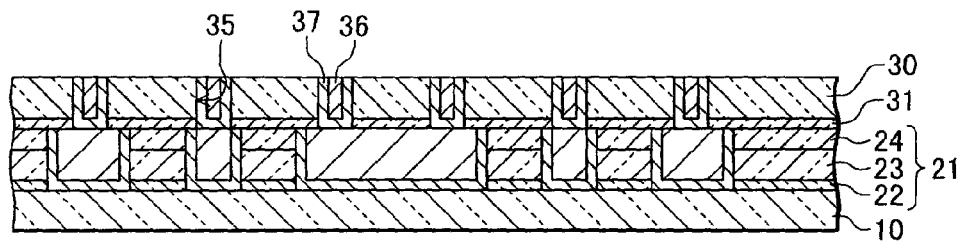

As shown in FIG. 3E, an etching stopper film 31 is formed which is made of silicon nitride and has a thickness of 50 nm. For example, the etching stopper film 31 can be formed by PE-CVD by using silane and ammonium as source gasses. On this etching stopper film 31, an interlayer insulating film 30 is formed which is made of silicon oxide and has a thickness of 500 nm. For example, the interlayer insulating film 30 can be formed by PE-CVD by using silane and oxygen as source gasses.

Via holes 35 are formed through the interlayer insulating film 30 and etching stopper film 31. Similar to the method of forming the pad 27, a barrier metal layer 37 and plug 36 are formed in the via hole 35 by forming a TaN layer and a Cu layer and performing a CMP process.

By repeating the above processes, the first to fourth wiring layers 20 shown in FIG. 1 can be formed.

Next, with reference to FIG. 1, a method of forming a multi layer structure above the fourth wiring layer 20 will be described.

On the fourth wiring layer 20, an etching stopper film 41 of silicon nitride and an interlayer insulating film 40 of silicon oxide are sequentially formed. The surface of the interlayer insulating film 40 is planarized by CMP. Via holes are formed through these two films. A TiN layer of 200 nm in thickness is formed covering the inner surfaces of the via holes 45 and the upper surface of the interlayer insulating film 40. On this TiN layer, a W layer of 400 nm in thickness is formed and filled in the via holes. Unnecessary regions of the W layer and TiN layer are removed by CMP to leave an adhesive layer 47 of TiN and a plug 46 of W in the via hole 45.

On the interlayer insulating film 40, a TiN layer of 50 nm in thickness, an AlCu alloy layer of 1000 nm in thickness and a TiN layer of 50 nm in thickness are sequentially formed. These three layers are patterned to leave a barrier metal layer 51 of TiN, a pad 50 of AlCu alloy and a barrier metal layer 52 of TiN. Etching these three layers can be performed by RIE by using chlorine containing gas (e.g., mixture gas of $Cl_2$, $O_2$ and Ar). With this process, a wiring 60 is formed.

On the interlayer insulating film 40, a silicon oxide film 70A of 1000 nm in thickness covering the pad 50 and wiring 60 and a silicon nitride film 70B of 500 nm in thickness are sequentially formed. An opening 71 is formed through the three layers, the silicon nitride film 70B, silicon oxide film 70A and barrier metal layer 52. Etching the two layers, the silicon nitride film 70B and silicon oxide film 70A, can be performed by RIE by using CF containing gas, and etching the barrier metal layer 52 can be performed by RIE by using chlorine containing gas.

A semiconductor element formed on the surface of the semiconductor substrate 1 is inspected by making an inspection probe contact the pad 50. If the inspection result succeeds, the semiconductor substrate 1 is scribed along a scribe line to separate chips. If the pad 50 is disposed in the scribe area, the original structure of the pad 50 and underlying pads 27 shown in FIG. 1 is broken. However, some portions of the pad 50 and underlying pads 27 are left in some cases. If the pad 50 is disposed in a chip area, the pad 50 and underlying pads 27 are left in the chip.

Next, with reference to FIGS. 4A to 4C, the positional relation between plugs and insulating regions in the pad will be described.

Figure 4A:
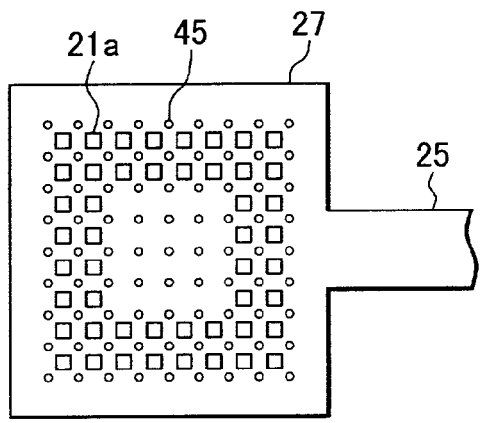
FIGS. 4A to 4C are plan views showing the positional relation between pad insulating regions and via holes.
Figure 4B:
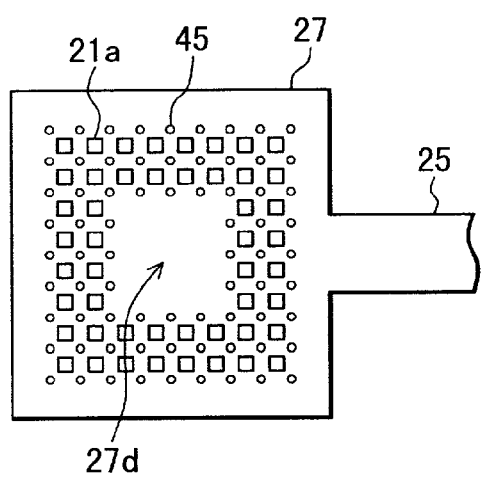

FIG. 4A is a diagram showing an example of the positional relation between via holes 45 and insulating regions 21a disposed in the pad 27. The via hole 45 is disposed so as to superpose upon the insulating region 21a. Namely, the via hole 45 is included in the conductive area of the pad 27.

With this layout, even if over-etching occurs while the via holes 45 shown in FIG. 1 are formed, the underlying intra-layer insulating film 21 is not exposed. It is therefore possible to prevent the tight adhesion from being lowered by absorption of moisture by the intermediate film 23 of the intra-layer insulating film 21.

The via holes 45 shown in FIG. 4A are distributed generally uniformly in the pad 27. In the example shown in FIG. 4B, via holes 45 are not disposed in the central area 27d. The effects of the structure shown in FIG. 4B will be described hereinunder.

Since the insulating regions 21a are not disposed in the central area 27d, dishing may be formed in the central area 27d of the pad 27 by CMP. If dishing is formed, the interlayer insulating film 40 on the central area 27d of the pad 27 in the fourth wiring layer shown in FIG. 1 becomes substantially thick. Via holes in the central area 27d do not penetrate through the interlayer insulating film 40 in some cases. Penetration defects of via holes can be prevented by not disposing via holes in the central area 27d as shown in FIG. 4B.

If there are via holes with penetration defects, the substantial number of plugs for connecting upper and lower pads reduces. Therefore, current per one plug exceeds a design value. The structure similar to that shown in FIG. 4b may be applied to the pads 27 in the other wiring layers, not being limited only to the fourth wiring layer.

Figure 4C:
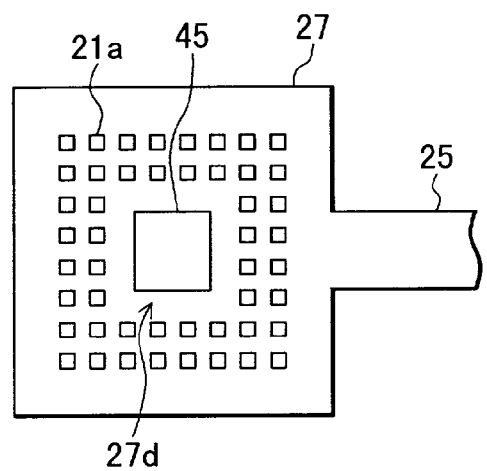

As shown in FIG. 4C, a single large via hole 45 may be disposed in the central area 27d where the insulating regions 21a are not disposed.

Figure 5:
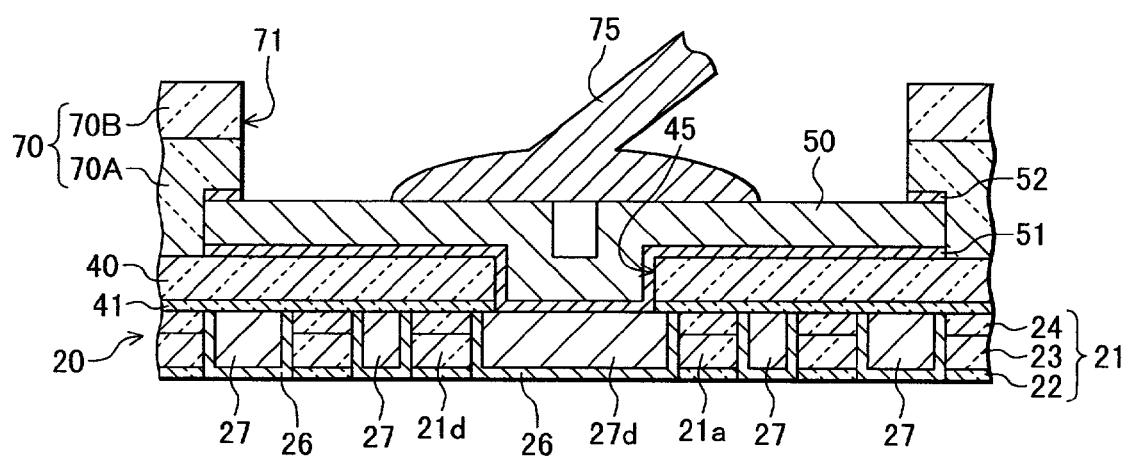
FIG. 5 is a cross sectional view of a pad having via holes disposed only in the central area of the pad.

FIG. 5 is a cross sectional view of the pad shown in FIG. 4C. On the fourth wiring layer 20, an etching stopper film 41 and an interlayer insulating film 40 are formed. A via hole 45 passing through these two layers is formed in the area included in the central area 27d of the pad 27. A pad 50 is formed above the interlayer insulating film 40. The pad 50 is electrically connected via the via hole 45 to the central area 27d of the pad 27 disposed in the fourth wiring layer 20. A barrier metal 51 is disposed between the bottom of the pad 50 and the surface of its underlying layer. The structure above the pad 50 is similar to that of the semiconductor device shown in FIG. 1.

Figure 6A:
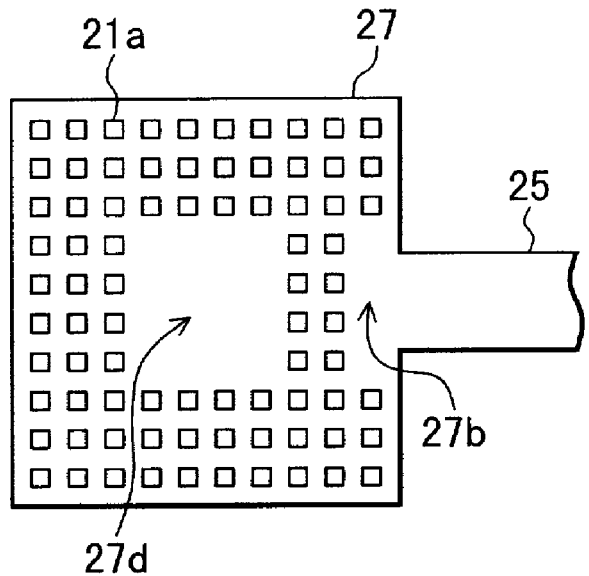
FIGS. 6A and 6B are plan views showing the structures of other pads.
Figure 6B:
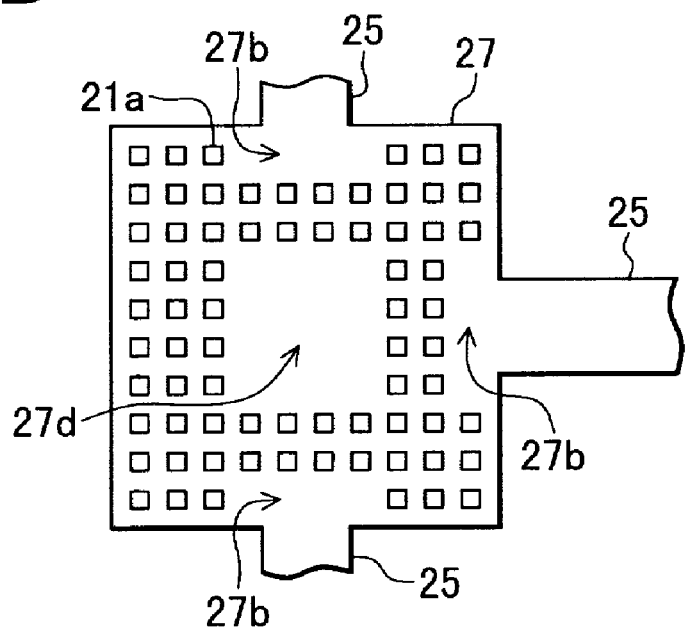

A contact area between a conductive wire 75 and pad 50 extends outward relative to the via hole 45. Therefore, as viewed along a direction parallel to the substrate normal, the contact area between the conductive wire 75 and pad 50 partially overlaps the interlayer insulating film 40. The interlayer insulating film 40 made of silicon oxide is harder than the pad 27 made of Cu. A high tight adhesion between the conductive wire 75 and pad 50 can be attained in an area where the contact area between the conductive wire 75 and pad 50 overlaps the interlayer insulating film 40. FIGS. 6A and 6B show examples of other structures of the pad 27. In the structure shown in FIG. 6A, insulating regions 21a are disposed in the first frame area 27a shown in FIG. 2A excepting the near wiring area 27b. Since the insulating regions 21a are not disposed in the near wiring area 27b, excessive current concentration can be avoided.

In the structure shown in FIG. 6B, wiring patterns 25 are connected to three sides of a square pad 27. Near wiring areas 27b are disposed in correspondence with the three wiring patterns 25. With this layout, excessive current concentration can be avoided when current flows in any one of the wiring patterns 25.

Figure 7A:
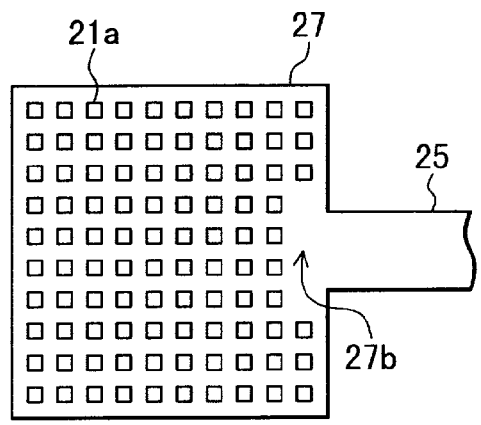
FIGS. 7A to 7C are plan views showing the structures of other pads.
Figure 7B:
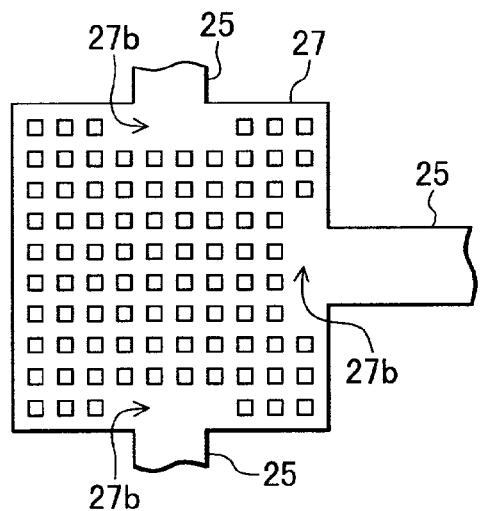
Figure 7C:
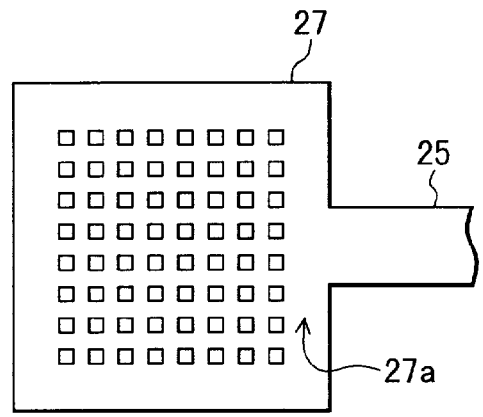

FIGS. 7A to 7C show examples of other structures of the pad 27. In the structure shown in FIG. 2A and FIGS. 6A and 6B, the insulating regions 21a are not disposed in the central area 27d. In the examples of the structures shown in FIGS. 7A to 7C, insulating regions 21a are disposed also in the central area 27d. The layouts of the insulating regions 21a in the area excepting the central areas 27d of the pads 27 shown in FIGS. 7A to 7C are similar to the layouts of the pads 27 shown in FIGS. 6A and 6B and FIG. 2A.

The pad 27 which is not required to contact an inspection probe may have the structures shown in FIGS. 7A to 7C. Since the insulating regions 21a are disposed in the central area 27d, dishing is not formed in the central area 27d.

In the first embodiment described above, the intra-layer insulating film 21 includes the intermediate film 23 made of silicon oxide doped with fluorine. The intermediate film 23 may be made of polyallyl ether. The intra-layer insulating film 21 may have a two-layer structure of the etching stopper film and silicon oxide film.

Next, with reference to FIGS. 8A to 8E, a semiconductor device and its manufacture method according to a second embodiment of the invention will be described. In the first embodiment, wiring patterns and plugs are formed by a single damascene method. In the second embodiment, they are formed by a dual damascene method.

Figure 8A:
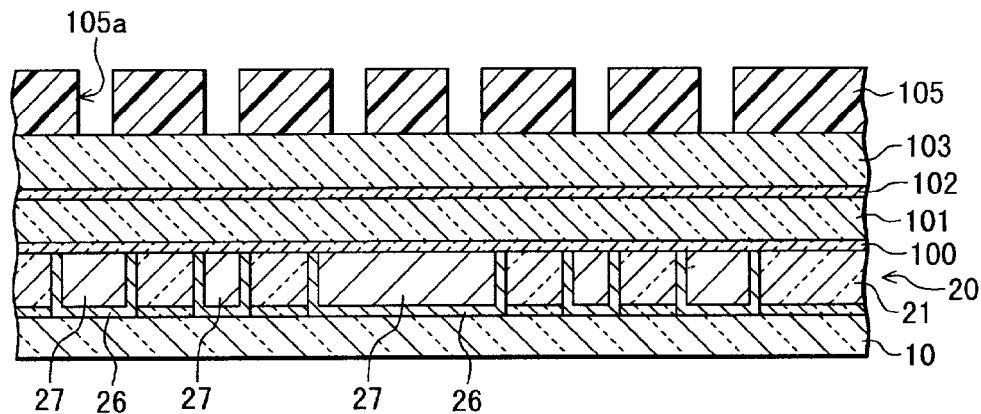
FIGS. 8A to 8E are cross sectional views illustrating a method of manufacturing a semiconductor device according to a second embodiment.

Processes of forming the structure shown in FIG. 8A will be described. The structure under an interlayer insulating film 10 shown in FIG. 8A is the same as the structure under the interlayer insulating film 10 of the semiconductor device of the first embodiment shown in FIG. 1.

A first wiring layer 20 is formed on the interlayer insulating film 10. The intra-layer insulating film 21 in the first wiring layer 20 shown in FIG. 1 has the three-layer structure of the etching stopper film 22, layer 23 of silicon oxide doped with fluorine and silicon oxide layer 24. An intra-layer insulating film 21 of the semiconductor device of the second embodiment has a two-layer structure of an etching stopper film of silicon nitride and a silicon oxide layer. A pad 27 is filled in a recess formed in the intra-layer insulating film 21. A barrier metal layer 26 is disposed between the inner surface of the recess and the pad 27.

On the first wiring layer 20, a first etching stopper film 100, an interlayer insulating film 101, a second etching stopper film 102, and an intra-layer insulating film 103 are sequentially formed. Each of the first and second etching stopper films 100 and 102 is made of silicon nitride and has a thickness of 50 nm. Each of the interlayer insulating film 101 and intra-layer insulating film 103 is made of silicon oxide and has a thickness of 350 nm.

A resist pattern 105 is formed on the intra-layer insulating film 103. Openings 105a corresponding to via holes 35 such as shown in FIG. 1 are formed through the resist pattern 105. By using the resist pattern 105 as a mask, the intra-layer insulating film 103, second etching stopper film 102 and interlayer insulating film 101 are etched to partially expose the first etching stopper film 100. Etching these films can be performed by anisotropic RIE by using CF containing gas. By using various gasses having different content ratios between C and F, it becomes possible to etch the silicon nitride film or use the silicon nitride film as an etching stopper film. By changing etchant gas during an etching process, it becomes possible to etch the second etching stopper film 102 and stop etching at the upper surface of the first etching stopper film 100. After etching, the resist pattern 105 is removed.

Figure 8B:
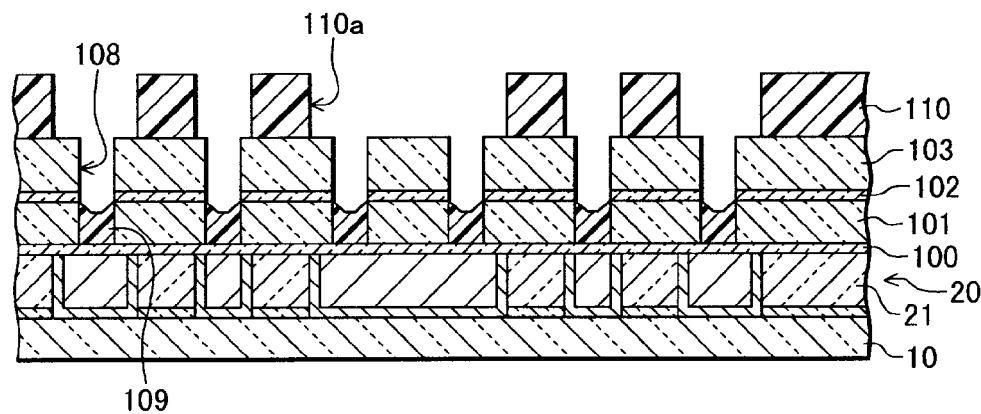

As shown in FIG. 8B, via holes 108 are therefore formed which pass through the intra-layer insulating film 103, second etching stopper film 102 and interlayer insulating film 101. After resin is coated on the substrate surface, the resin is melted to fill resin 109 in the via holes 108 in spaces deeper than the bottom of the second etching stopper film 102. A heat treatment is performed to harden the resin 109. For example, resist material with photosensitive material being removed may be used as the material of the resin 109.

A resist pattern 110 is formed on the surface of the intra-layer insulating film 103. Openings 110a corresponding to pads 27 such as shown in FIG. 1 are formed through the resist pattern 110. By using the resist pattern 110 as a mask, the intra-layer insulating film 103 is etched. This etching can be performed by anisotropic RIE by using CF containing gas. After etching, the resist pattern 110 and resin 109 are removed by ashing.

Figure 8C:
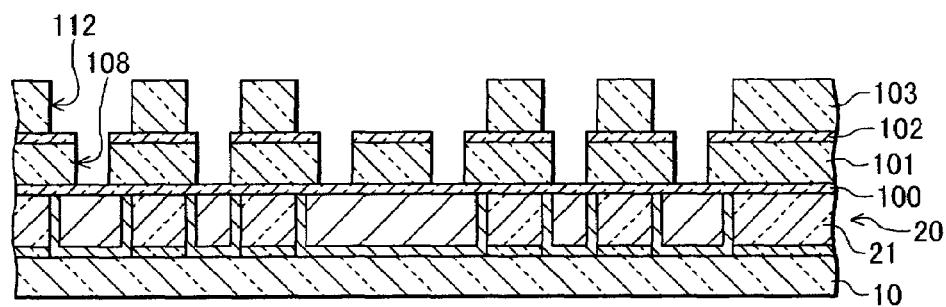

As shown in FIG. 8C, recesses 112 are therefore formed which reach the bottom of the intra-layer insulating film 103. The via hole 108 is open in a partial area of the bottom of the recess 112. By using the intra-insulating film 103 as a mask, the second etching stopper film 102 is etched and at the same time, by using the interlayer insulating film 101 as a mask, the first etching stopper film 100 is etched.

Figure 8D:
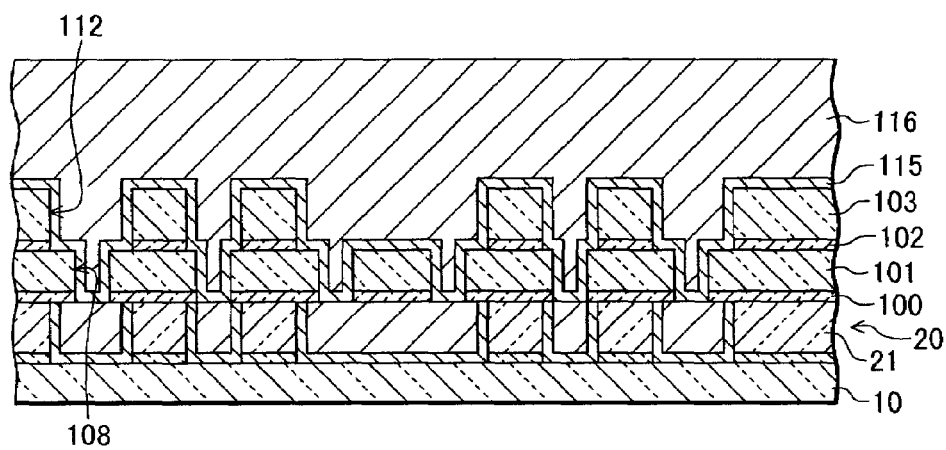

As shown in FIG. 8D, the exposed regions of the etching stopper films 100 and 102 are removed. A barrier metal layer 115 is deposited to cover the inner surfaces of the via holes 108, the inner surfaces of the recesses 112 and the surface of the intra-layer insulating film 103. For example, the barrier metal layer 115 is made of TaN or Ta and has a thickness of 30 nm.

A conductive film 116 is formed on the barrier metal layer 115. For example, the conductive film 116 is made of Cu and has a thickness of 1500 nm. The conductive film 116 can be formed by forming a seed layer of Cu by sputtering and thereafter by plating Cu. The insides of the via holes 108 and recesses 112 are buried with the conductive film 116.

Figure 8E:
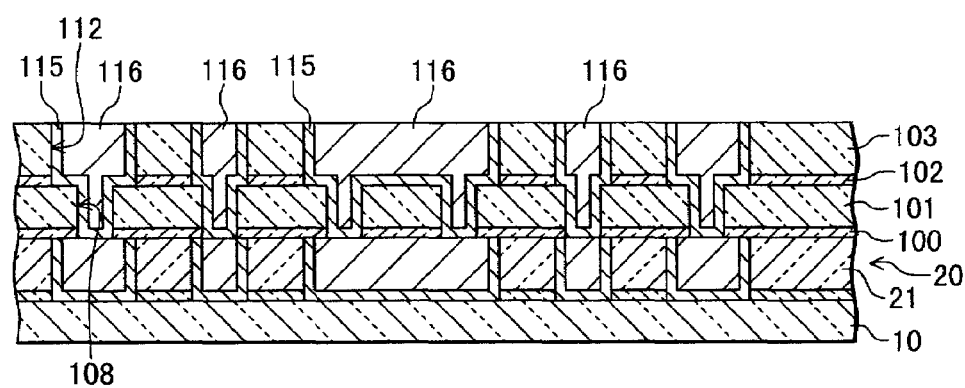
Figure 9A:
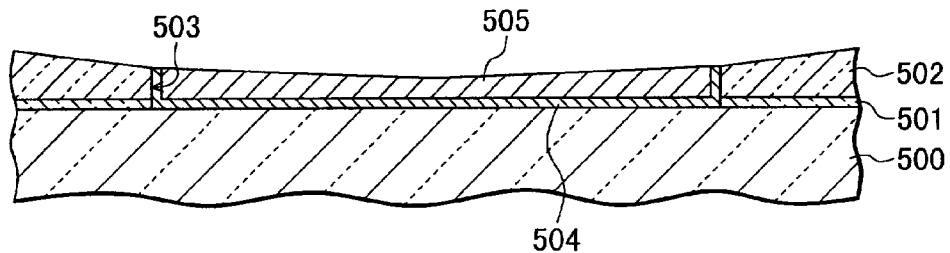
FIGS. 9A to 9D are cross sectional views of pads used with conventional semiconductor devices.
Figure 9B:
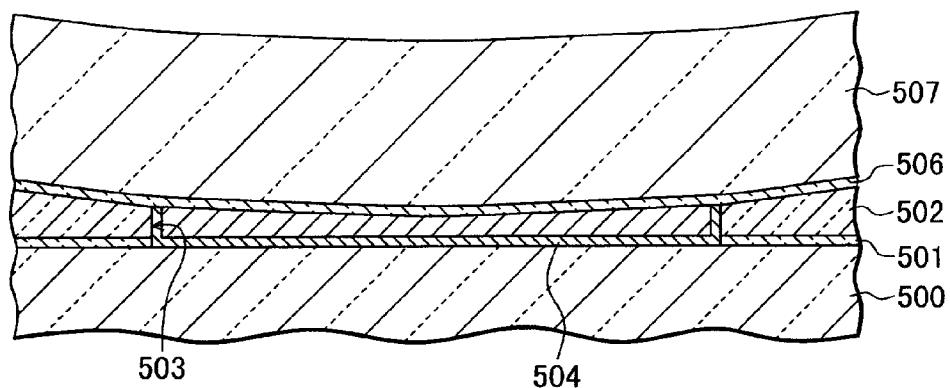
Figure 9C:
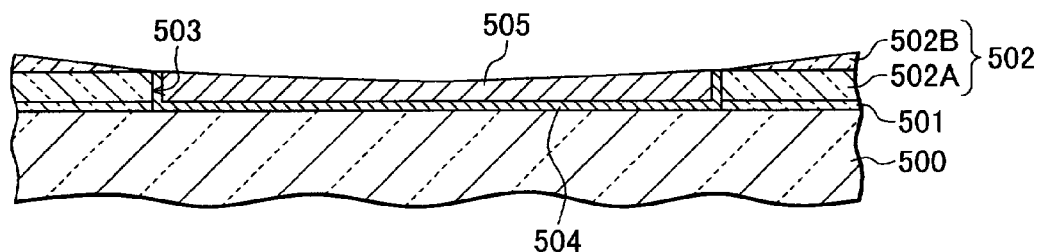
Figure 9D:
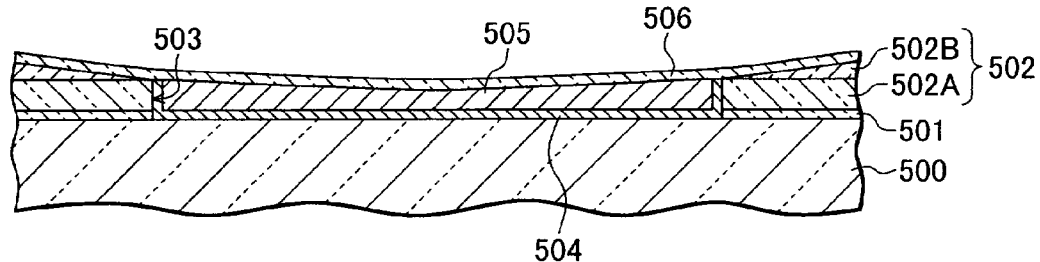

As shown in FIG. 8E, CMP is performed until the upper surface of the intra-layer insulating film 103 is exposed, to remove unnecessary regions of the conductive film 116 and barrier metal layer 115. The conductive film 116 is therefore left in the via holes 108 and recesses 112. Some island regions of the intra-layer insulating film 103 are left in the recesses which define pads. It is therefore possible to suppress dishing and erosion to be formed during CMP. By repeating similar processes, a multi layer wiring structure can be formed.

Similar effects to the first embodiment can also be obtained by the second embodiment which forms pads by using a dual damascene method.

Figure 13:
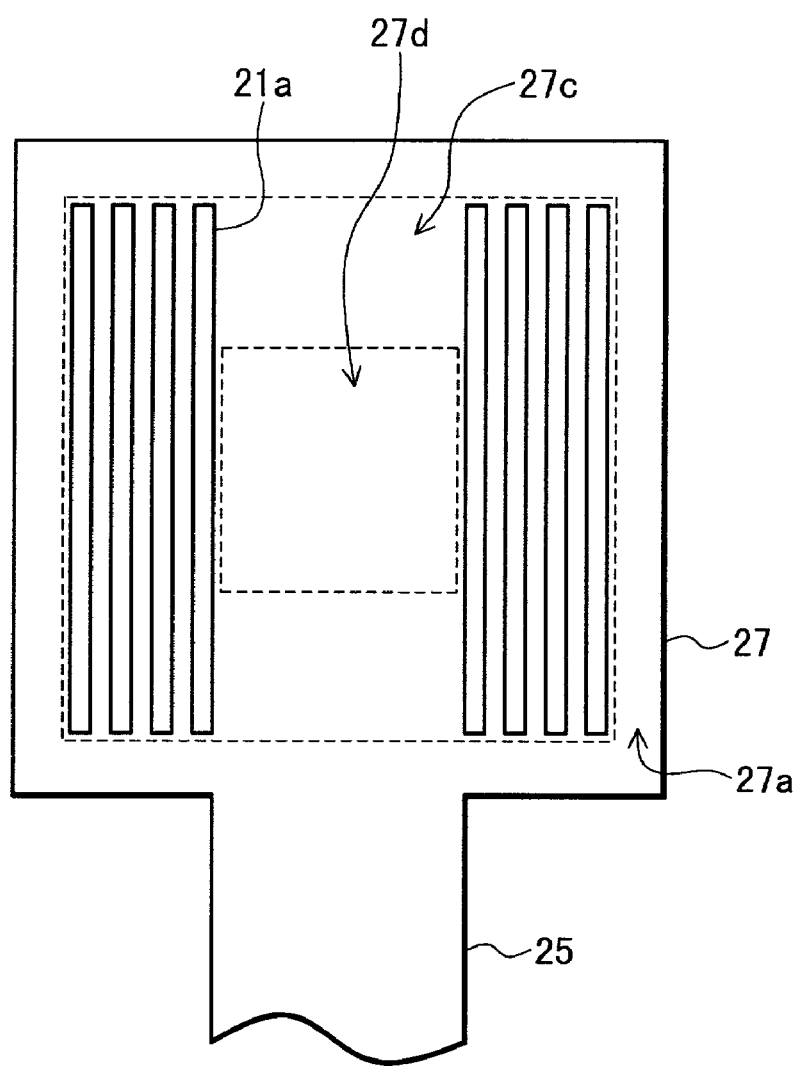
FIG. 13 is a plan view showing another structure of a pad.

FIG. 13 is a plan view showing another structure of a pad 27. In the embodiments described above, for example, as shown in FIG. 2A, the insulating regions 21a are generally regularly disposed in a matrix shape in the second frame area of the pad 27. As shown in FIG. 13, a plurality of elongated insulating regions 21a may be disposed in areas corresponding to two opposing sides of a square second frame region 27c. In this case, a wiring pattern 25 is connected to the outer periphery of the pad 27 corresponding to the side of the second frame area 27c not disposed with the insulating regions 21a.

Also in this case, since insulating regions 21a are partially disposed, erosion and dishing can be suppressed. Since the whole of a central area 27d becomes a conductive area, a conductive probe can be made in contact with this area reliably and excessive current concentration can be avoided.

The present invention has been described in connection with the preferred embodiments. The invention is not limited only to the above embodiments. It is apparent that various modifications, improvements, combinations, and the like can be made by those skilled in the art.

I claim:

1. A semiconductor device comprising:
a semiconductor substrate;
a first interlayer insulating film made of insulating material and formed on the semiconductor substrate;
a first intra-layer insulating film made of insulating material and formed on the first interlayer insulating film, the first intra-layer insulating film being formed with a recess reaching a bottom of the first intra-layer insulating film, the recess having a pad part and a wiring part continuous with the pad part, the pad part having a width wider than a width of the wiring part,
a plurality of insulating regions disposed on the bottom of the pad part, and the recess being formed so that the insulating regions are not disposed in a near wiring area superposed upon an extended area of the wiring part into the pad part, within a first frame area having as an outer periphery an outer periphery of the pad part and having a first width but disposed in a second frame area having as an outer periphery an inner periphery of the first frame area and having a second width;
a first pad filled in the pad part of the recess; and
a wiring filled in the wiring part of the recess,
wherein upper surfaces of said first pad, said wiring and said insulating regions are on a same level,
wherein said first pad contained in said pad part of said recess has a continuous body,
wherein the insulating regions are disposed regularly in the second frame area along a first direction at a first period P, and a width of the first frame area along the first direction is equal to or wider than said first period P,
wherein said first period P is a distance from one insulating region to another insulating region of said plurality of insulating regions including a width of said one insulating region.

2. A semiconductor device according to claim 1, further comprising:
 a second interlayer insulating film formed on the first intra-layer insulating film, the first pad and the wiring, the second interlayer insulating film being formed with at least one via hole, the via hole being disposed partially superposing upon the first pad as viewed along a direction parallel to a substrate normal; and
 a second pad formed on the second interlayer insulating film, the second pad being connected to the first pad via a region in the via hole.

3. A semiconductor device according to claim 2, wherein the via hole are included in the first pad as viewed along a direction parallel to a substrate normal.

4. A semiconductor device according to claim 2, further comprising a conductive wire wire-bonded to the second pad, wherein the insulating regions are not disposed in a central area on an inner side of the second frame area, the via hole are disposed in the central area, and a contact area between the conductive wire and the second pad extends to an area on an outer side of the via hole as viewed along a direction parallel to a substrate normal.

5. A semiconductor device according to claim 1, wherein the insulating regions are not disposed in a central area on an inner side of the second frame area.

6. A semiconductor device according to claim 1, wherein the width of said pad part and the width of said wiring part are widths in a direction parallel to a boundary line between said pad part and said wiring part.

7. A semiconductor device according to claim 1, wherein said first pad and said wiring are made of a conductive material.

8. A semiconductor device according to claim 1, wherein a bottom of the recess formed in the first intra-layer insulating film is defined by the first interlayer insulating film.

9. A semiconductor device comprising:
 a semiconductor substrate;
 a first interlayer insulating film made of insulating material and formed on the semiconductor substrate;
 a first intra-layer insulating film made of insulating material and formed on the first interlayer insulating film, the first intra-layer insulating film being formed with a recess reaching a bottom of the first intra-layer insulating film, the recess having a pad part and a wiring part continuous with the pad part, the pad part having a width wider than a width of the wiring part,
 a plurality of insulating regions disposed on the bottom of the pad part, and the recess being formed so that the insulating regions are not disposed in a near wiring area superposed upon an extended area of the wiring part into the pad part, within a first frame area having as an outer periphery an outer periphery of the pad part and having a first width but disposed in a second frame area having as an outer periphery an inner periphery of the first frame area and having a second width;
 a first pad filled in the pad part of the recess; and
 a wiring filled in the wiring part of the recess,
 wherein upper surfaces of said first pad, said wiring and said insulating regions are on a same level,
 wherein the wiring width W1 is in a range from 5 μm to 10 μm, and L1/W1 is 35% or higher,
 wherein W1 corresponds to the width of said wiring part, L1 corresponds to said first width.

10. A semiconductor device according to claim 9, wherein the width of said pad part and the width of said wiring part are widths in a direction parallel to a boundary line between said pad part and said wiring part.

11. A semiconductor device according to claim 9, wherein said first pad and said wiring are made of a conductive material.

12. A semiconductor device comprising:
 a semiconductor substrate;
 a first interlayer insulating film made of insulating material and formed on the semiconductor substrate;
 a first intra-layer insulating film made of insulating material and formed on the first interlayer insulating film, the first intra-layer insulating film being formed with a recess reaching a bottom of the first intra-layer insulating film, the recess having a pad part and a wiring part continuous with the pad part, the pad part having a width wider than a width of the wiring part,
 a plurality of insulating regions disposed on the bottom of the pad part, and the recess being formed so that the insulating regions are not disposed in a near wiring area superposed upon an extended area of the wiring part into the pad part, within a first frame area having as an outer periphery an outer periphery of the pad part and having a first width but disposed in a second frame area having as an outer periphery an inner periphery of the first frame area and having a second width;
 a first pad filled in the pad part of the recess; and
 a wiring filled in the wiring part of the recess,
 wherein upper surfaces of said first pad, said wiring and said insulating regions are on a same level,
 wherein the wiring width W1 is narrower than 5 μm, and L1/W1 is 30% or higher,
 wherein W1 corresponds to the width of said wiring part, L1 corresponds to said first width.

13. A semiconductor device according to claim 12, wherein the width of said pad part and the width of said wiring part are widths in a direction parallel to a boundary line between said pad part and said wiring part.

14. A semiconductor device according to claim 12, wherein said first pad and said wiring are made of a conductive material.

15. A semiconductor device according to claim 12, wherein said first pad is made of a conductive material.

16. A semiconductor device comprising:
 a semiconductor substrate;
 a first interlayer insulating film made of insulating material and formed on the semiconductor substrate;
 a first intra-layer insulating film made of insulating material and formed on the first interlayer insulating film, the first intra-layer insulating film being formed with a recess reaching a bottom of the first intra-layer insulating film, the recess having a pad part,
 a plurality of insulating regions disposed on the bottom of the pad part, and the recess being formed so that the insulating regions are not disposed in a first frame area having as an outer periphery an outer periphery of the pad part and having a first width but disposed in a second frame area having as an outer periphery an inner periphery of the first frame area and having a second width; and
 a first pad filled in the pad part of the recess,
 wherein upper surfaces of said first pad and said insulating regions are on a same level,
 wherein the insulating regions are disposed regularly in the second frame area along a first direction at a first pitch, and a width of the first frame area along the first direction is equal to or wider than the first pitch.

* * * * *